(12) United States Patent
Fratti

(10) Patent No.: US 7,379,510 B2
(45) Date of Patent: May 27, 2008

(54) OC192 PEAK DETECT CIRCUIT HAVING LOW PARASITICS, HIGH DYNAMIC RANGE AND HIGH SENSITIVITY

(75) Inventor: Roger A. Fratti, Mohnton, PA (US)

(73) Assignee: Agere Systems Inc., Allentown, PA (US)

( * ) Notice: Subject to any disclaimer, the term of this patent is extended or adjusted under 35 U.S.C. 154(b) by 743 days.

(21) Appl. No.: 10/751,534

(22) Filed: Jan. 6, 2004

(65) Prior Publication Data

US 2005/0147185 A1 Jul. 7, 2005

(51) Int. Cl.
*H03K 9/00* (2006.01)

(52) U.S. Cl. .................................... 375/316

(58) Field of Classification Search ............... 375/316, 375/345; 323/208, 209, 218, 233, 364; 326/30; 327/330; 330/282, 292, 167, 189, 196; 379/30
See application file for complete search history.

(56) References Cited

U.S. PATENT DOCUMENTS 6,275,541 B1 * 8/2001 Nagahori et al. ........... 375/318
6,674,312 B2 * 1/2004 Poskatcheev ............... 327/67
2004/0012446 A1 * 1/2004 Ichitsubo et al. ........... 330/285

OTHER PUBLICATIONS

RF Micro Device, Inc. Investor Relations http://www.corporate-ir.net/ireye/ir_site.zhtml?ticker=RFMD&script=410&layout=-6&item_id=262277 Feb. 25, 2002.*
Limiting Amp—Serial at 3.125 Gbps, RF Micro-Devices, 13-1-13-9.
Limiting Amp—Serial at 3.125 Gbps, RF Micro-Devices, 13-1-13-9. 2002.

* cited by examiner

*Primary Examiner*—Sam K Ahn

(57) ABSTRACT

Accurate measurement of a signal at extremely high data rates such as OC192 is accomplished, to provide a high dynamic range. A data receiver comprises a limiting amplifier comprising a plurality of amplifier stages. A peak detector measures a voltage level of an input to the limiting amplifier. An input to the peak detector is connected directly to an input of a first stage of the limiting amplifier. Transmission lines used between the input to the peak detector and the input of the first stage of the limiting amplifier are impedance matched such that the peak detector appears as a load with insignificant capacitance with respect to the extremely high data rate of a signal on the input. Also, a same bias is provided to both the input stage of the limiting amplifier as well as to the peak detector.

11 Claims, 6 Drawing Sheets

OC192 PEAK DETECT CIRCUIT HAVING LOW PARASITICS, HIGH DYNAMIC RANGE AND HIGH SENSITIVITY

BACKGROUND OF THE INVENTION

1. Field of the Invention

This invention relates to the design and use of a peak detection circuit for use at extremely high data rates, e.g., at OC48 (2.5 Gb/s) and OC192 (10 Gb/s) data rates.

2. Background of Related Art

It is often desired to measure the input signal level in a system. However, direct measurement of an input signal becomes difficult in a system receiving a signal having an extremely high data rate, such as those referred to as OC48 data rates (approximately 2.5 Gigabits per second (2.5 Gb/s) and OC192 data rates (9.9582 Gb/s, or approximately 10 Gb/s). This is because sensitivity of the input line, particularly to added parasitics, may otherwise cause difficulty in detection of the underlying signal. This reduced sensitivity which results from the added parasitics is a deleterious effect because of a more difficult impedance matching problem that needs to be overcome. This problem is minimized by generating the bias voltages for both the input of the peak detector circuit and the input of the $1^{st}$ amplifier stage simultaneously. This circuitry used to generate this voltage is therefore minimal in component count and as a result reduces the amount of parasitics attached to the critical input nodes.

Conventionally, to measure the input signal level of such high data rate systems, the input signal is measured after a first or second stage of a limiting amplifier. A limiting amplifier is an amplifier that has a very high gain, e.g., amplifying a very low signal such as 1-2 mV peak-to-peak signal, into a much larger signal, such as a 500 mV peak-to-peak signal. A limiting amplifier is known as a 'limiting' amplifier because of the occurrence of saturation at the output. With the very high gain, the input signal is boosted to a useable level, but the output may be clamped, or limited due to saturation.

The first or second stages of the limiting amplifier provide a buffer between the input signal and a peak detection circuit used to measure the input. Thus, conventional attempts at a peak detection circuit of an input of a limiting amplifier used at extremely high data rates such as OC192 or OC48 measure the input signal at a node down the signal stream, i.e., after at least one or more stages of gain have occurred. This is shown in FIG. 6. For example if a peak detector has a dynamic range of 1 volt and a voltage gain of 10 precedes the peak detector, the input dynamic range is only 0.1 volt.

The present inventor has appreciated that measurement of an input signal at a node down the signal stream limits the dynamic range of the peak detector, resulting in a smaller dynamic range than the actual range of the input signal.

There is a need for a peak detection architecture and method having a larger dynamic range, for use at extremely high data rates, such as OC48, OC192 and above.

SUMMARY OF THE INVENTION

In accordance with the principles of the present invention, a data receiver comprises a limiting amplifier comprising a plurality of amplifier stages. A peak detector measures a voltage level of an input to the limiting amplifier. An input to the peak detector is connected directly to an input of a first stage of the limiting amplifier. Transmission lines used between the input to the peak detector and the input of the first stage of the limiting amplifier are impedance matched such that the peak detector appears as a load with insignificant capacitance with respect to the extremely high data rate of a signal on the input.

In accordance with another aspect of the present invention, a method of measuring a signal having an extremely high data rate of at least 2.5 Gb/s input to a limiting amplifier comprises matching impedance between an input to a first stage of the limiting amplifier, and transmission leads connected between the input to the first stage of the limiting amplifier and an input to a peak detector. A signal having a data rate of at least 2.5 Gb/s being input to the first stage of the limiting amplifier is measured directly through an input to the peak detector connected directly to a first stage of the limiting amplifier.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

Figure 1:
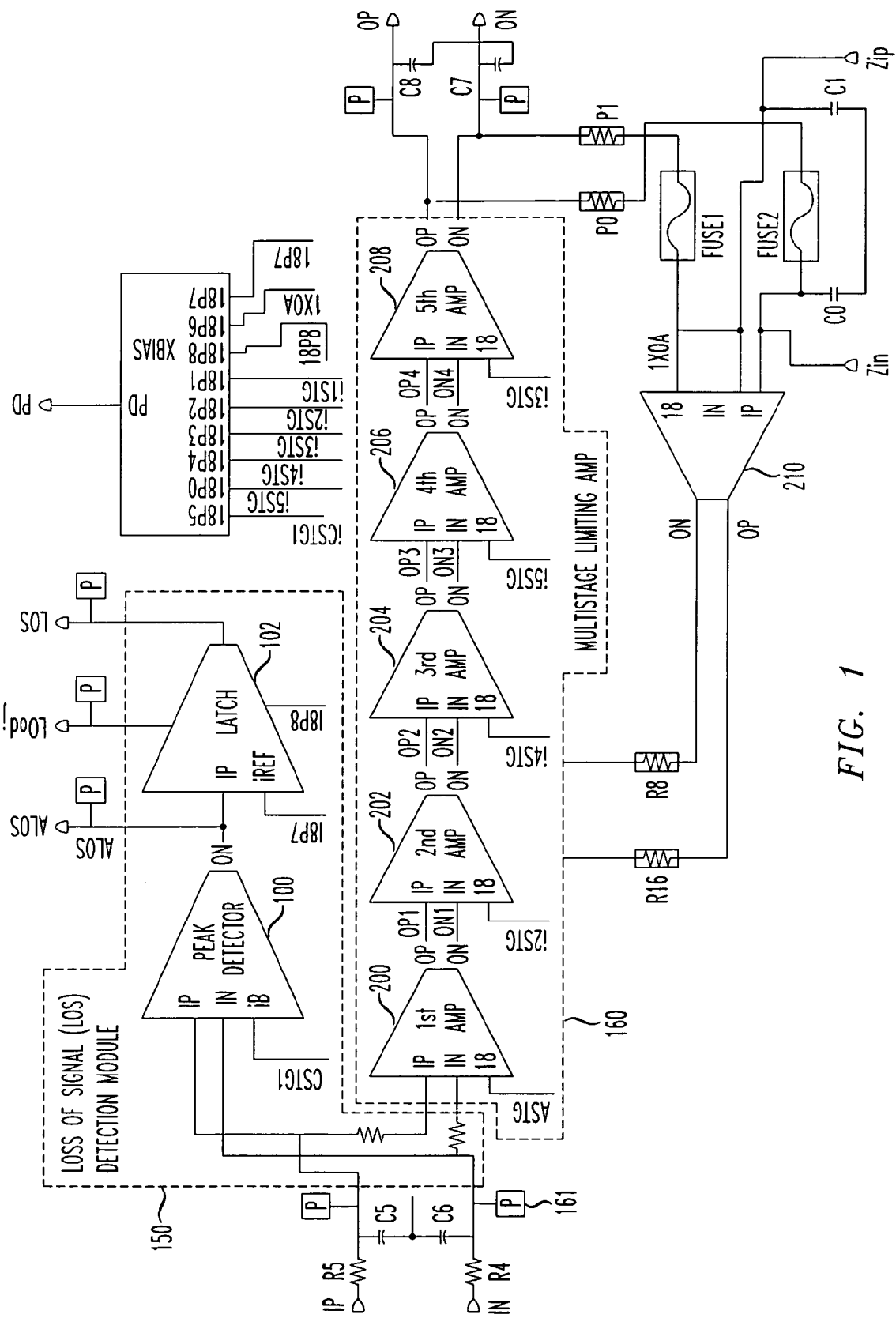
FIG. 1 shows a peak detector forming a loss of signal detection module, as biased from the input of a limiting amplifier, in accordance with the principles of the present invention.

This invention addresses the afore-mentioned problems by providing a peak detect circuit architecture with placement directly at the input to the first stage of a limiting amplifier, taking advantage of the wide dynamic range of the actual input signal.

To date there are no known OC192 or above peak detectors that are directly connected to the input of the limiting amplifiers. Conventional peak detectors are connected after the first or second gain stage of a limiting amplifier, reducing the load of the peak detector. However, the inventors herein recognized that placement of a peak detector after a first gain stage of a limiting amplifier greatly limits the dynamic range of the measured signal.

In accordance with the principles of the present invention, a data receiver comprises a limiting amplifier comprising a plurality of amplifier stages. A peak detector measures a voltage level of an input to the limiting amplifier. An input to the peak detector is connected directly to an input of a first stage of the limiting amplifier. Transmission lines used between the input to the peak detector and the input of the first stage of the limiting amplifier are impedance matched such that the peak detector appears as a load with insignificant capacitance with respect to the extremely high data rate of a signal on the input. The impact that capacitance, or in general, reactance, applied to the input node on the impedance matching problem is well understood. In general terms, the Fano bandwidth is a good measure of the level of difficulty for achieving broad bandwidths for a given reactive element. This Fano bandwidth is described very well in *Microwave Transistor Amplifiers, analysis and design* by G. Gonzalez which will be incorporated by reference. Fano's equation $$\int_0^\infty \ln|1/\Gamma|d\omega <= \pi/RC$$

basically states that for a given reactance C, a finite reflection coefficient can be achieved over the frequency range ω. Another way of interpreting this is that as the reactance gets larger, it is harder to achieve a good reflection coefficient, i.e. impedance match, for broad frequency bands.

Therefore it is easy to see that this invention which uses the bias circuitry to bias both the peak detector and input stage of the amplifier, limits reactances on the input node and becomes easier to match.

The impedance matching can take many forms. These forms can use distributed lengths of transmission lines to rotate and modify the impedances of the peak detector such that the when presented to the input node minimum impact on the node is realized. *The Design of Impedance Matching Networks for Radio-Frequency and Microwave Amplifiers* by Pieter Abrie discusses these techniques and will be incorporated as a reference. In one preferred embodiment, the input capacitance of the peak detector is determined from device modeling and circuit design. This impedance is then reflected through the appropriate length of transmission line so the input impedance of the transmission line is extremely high. The transmission line is of a low pass nature so that it will pass the DC voltage and currents from the input stage of the LNA to the input of the peak detector circuit.

FIG. 1 shows a peak detector forming a loss of signal detection module, as biased from the input of a limiting amplifier, in accordance with the principles of the present invention.

In particular, as shown in FIG. 1, a receiver including a multi-stage limiting amplifier 160 and a loss of signal (LOS) detection module 150. The receiver in the disclosed embodiment is wired to operate from a 3.3 volt power supply. However, operation at other voltages such as 5 volts are possible within the principles of the present invention.

The limiting amplifier 160 includes multiple amplifier stages 200, 202, 204, 206 and 208. The limiting amp 160 is associated with a feedback amplifier 210. The LOS detection module 150 includes a peak detector 100, and a latch 102.

The peak detector 100 is used to monitor an input power level to the limiting amp 160. The peak detector 100 rectifies input power, and provides an analog output signal, in the disclosed example used by the latch 102. As used herein, the peak detector 100 measures an amplitude of a signal before it is actually input to the limiting amplifier 160.

The latch 102 is used at the output of the peak detector 100. The latch 102 implements a trip point wherein if the signal input to the limiting amplifier 160 goes above a given level, the output of the latch 102 goes high (or low, depending upon the logic levels implemented).

A simple yet effective architecture is disclosed as an exemplary embodiment in which an extremely wide dynamic range is provided. In accordance with the principles of the present invention, a half-wave rectifier is DC coupled to the input of the limiting amp 160 through dispersive, distributed matching structure which allows the peak detector 100 to be connected directly to the input of the limiting amp 160 without degrading the input return loss or adding significant noise to the input of the limiting amp 160, thereby maintaining a high sensitivity in the overall receiver.

The transmission lines running from the input to the limiting amplifier 160 to the input of the peak detector 100, with the peak detector 100 acting as a load, are importantly impedance matched. These transmission lines are formed to have a very high characteristic impedance with respect to the input to the limiting amplifier 160, as compared to the input lines from die pads 161 to the first stage 200 of the limiting amplifier 160. Resistors R2 and R3 represent the DC resistance of the transmission lines, which ideally are matched to have low loss and high characteristic impedance. Accordingly, capacitive loading of the input lines to the first stage 200 of the limiting amplifier 160 is minimized in an OC192 receiver such that the reactance is much greater than the characteristic impedance of the input lines.

Figure 2:
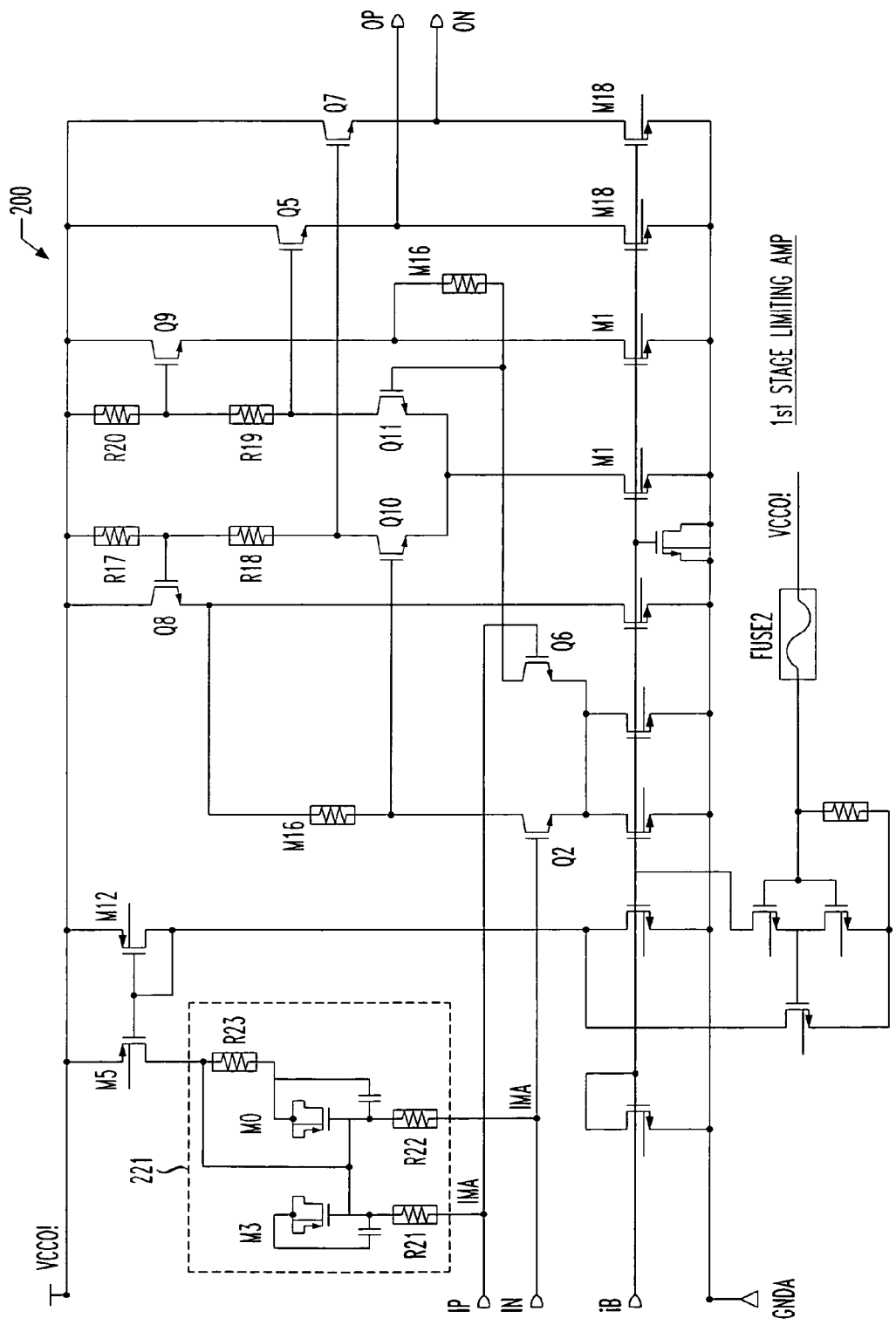
FIG. 2 shows an exemplary circuit of a $1^{st}$ stage of the limiting amplifier shown in FIG. 1, including a bias generator used to generate a bias to the input of the peak detector.

FIG. 2 shows an exemplary circuit of a $1^{st}$ stage 200 of the limiting amplifier 160 shown in FIG. 1, including a bias generator 221 used to generate a bias to the input of the peak detector 100.

In particular, as shown in FIG. 2, a bias generator 221 is formed by the PMOS transistors M3, M0 connected as capacitors, fed by the current mirror formed by PMOS transistors M5 and M12. A differential amplifier circuit is formed by npn transistors Q2 and Q6.

The bias generator 221, located within the first stage 200 of the limiting amplifier 160, sets up a base bias for the input stage 200 of the limiting amplifier 160. However, the bias generator 221 also sets up a bias/voltage for the input to the peak detector 100. The bias/voltage is placed on the IP and IN nodes of the first stage 200 of the limiting amplifier 160, as well as to the IP and IN nodes of the peak detector 100.

Using the bias generator 221 within the first stage of the limiting amplifier 200 to also bias the input to the peak detector 100 minimizes the total required circuitry. The minimization of circuitry on these critical nodes also minimizes the amount of parasitic capacitances on the input of the limiting amplifier. This in turn reduces the frequency variation of the input impedance resulting in a broader bandwidth response for the limiting amplifier. Also, impedance matching of the transmission lines used to transmit the bias current/voltage from the bias generator 221 to the peak detector 100 becomes more stable with the bias current/voltage running therethrough.

While it is recognized that a bias current/voltage may be provided separately to the peak detector 100 from a source other than inside the first stage 200 of the limiting amplifier 160, it is preferred in the disclosed embodiment. In the disclosed embodiment, a same bias is provided to both the input stage 200 of the limiting amplifier 160 as well as to the peak detector 100. The bias to the input stage 200 of the limiting amplifier 160 may be separately generated from the bias to the peak detector 100, but in any event is preferably approximately equal to one another. Thus, in accordance with this aspect of the invention, a bias used for a peak detector 100 is also used to bias an input stage of a limiting amplifier 160.

Figure 3:
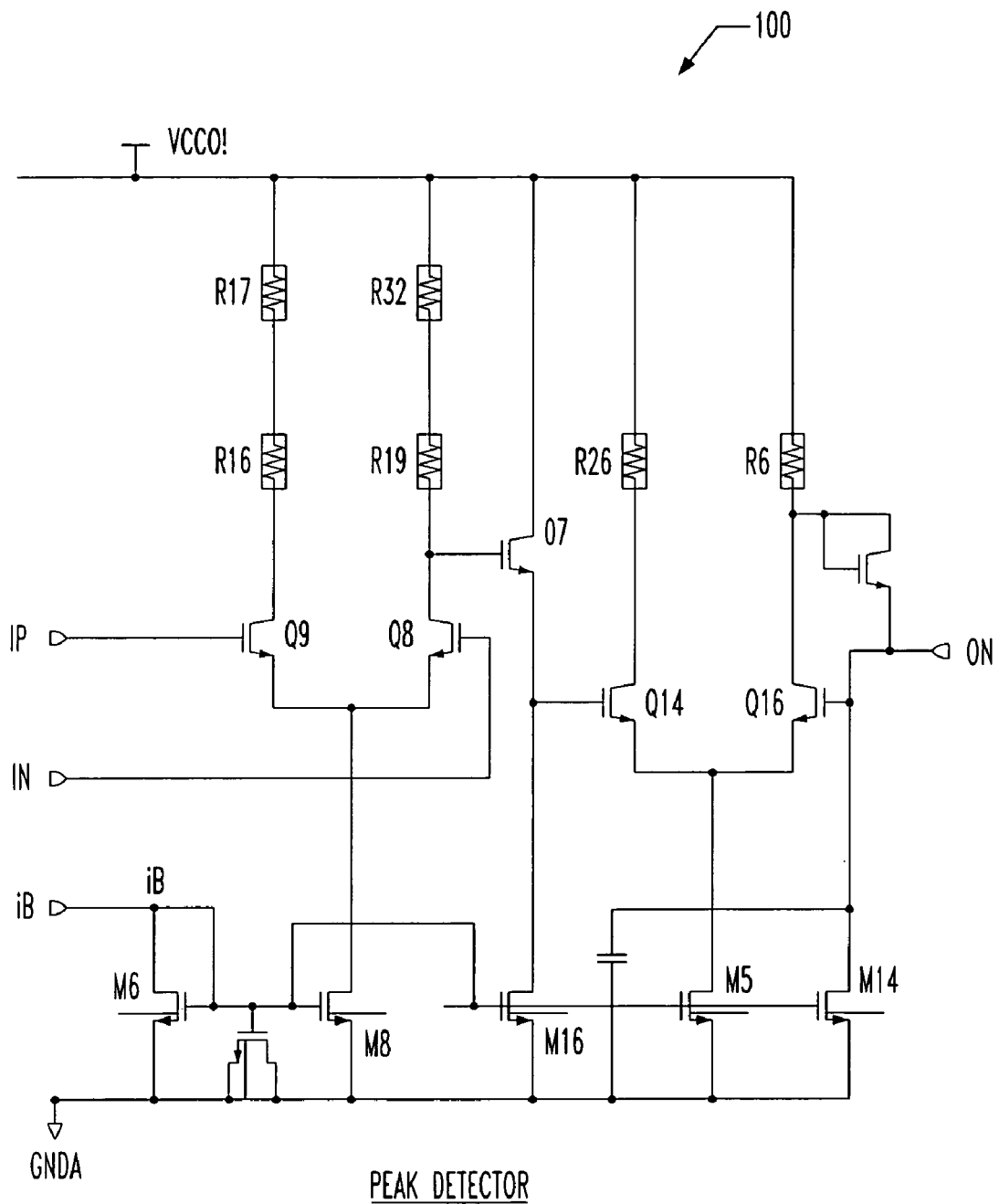
FIG. 3 shows an exemplary circuit of the peak detector shown in FIG. 1.

FIG. 3 shows an exemplary circuit of the peak detector 100 shown in FIG. 1.

In particular, as shown in FIG. 3, the peak detector 100 noticeably does not include a bias generator circuit. As discussed, that is because in the disclosed embodiment the bias to the input of the peak detector 100 is generated in a bias generator circuit 221 formed within the first stage 200 of the limiting amplifier 160. The peak detector does include a standard differential amplifier pair Q8, Q9 to amplify the signal at not only the input of the peak detector 100, but also the signal as it is presented to the input of the first stage 200 of the limiting amplifier 160.

Figure 4:
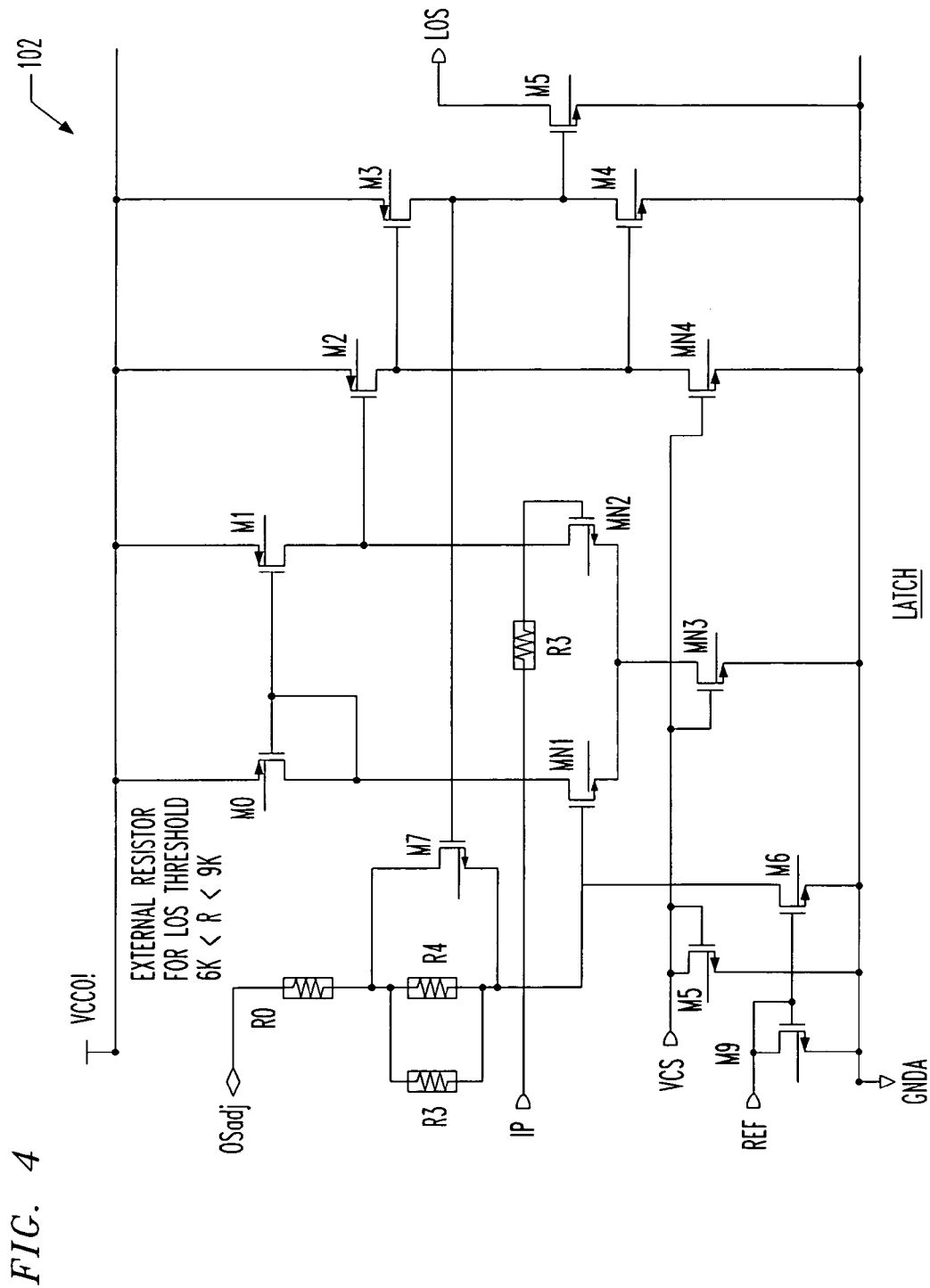
FIG. 4 shows an exemplary circuit of the latch of the loss of signal detection module shown in FIG. 1.

FIG. 4 shows an exemplary circuit of the latch 102 of the loss of signal detection module 150 shown in FIG. 1. The latch 102 is of otherwise conventional design and construction, and does not require a detailed explanation of the figure for persons of ordinary skill in the art to get a full understanding of its architecture and operation.

Figure 5:
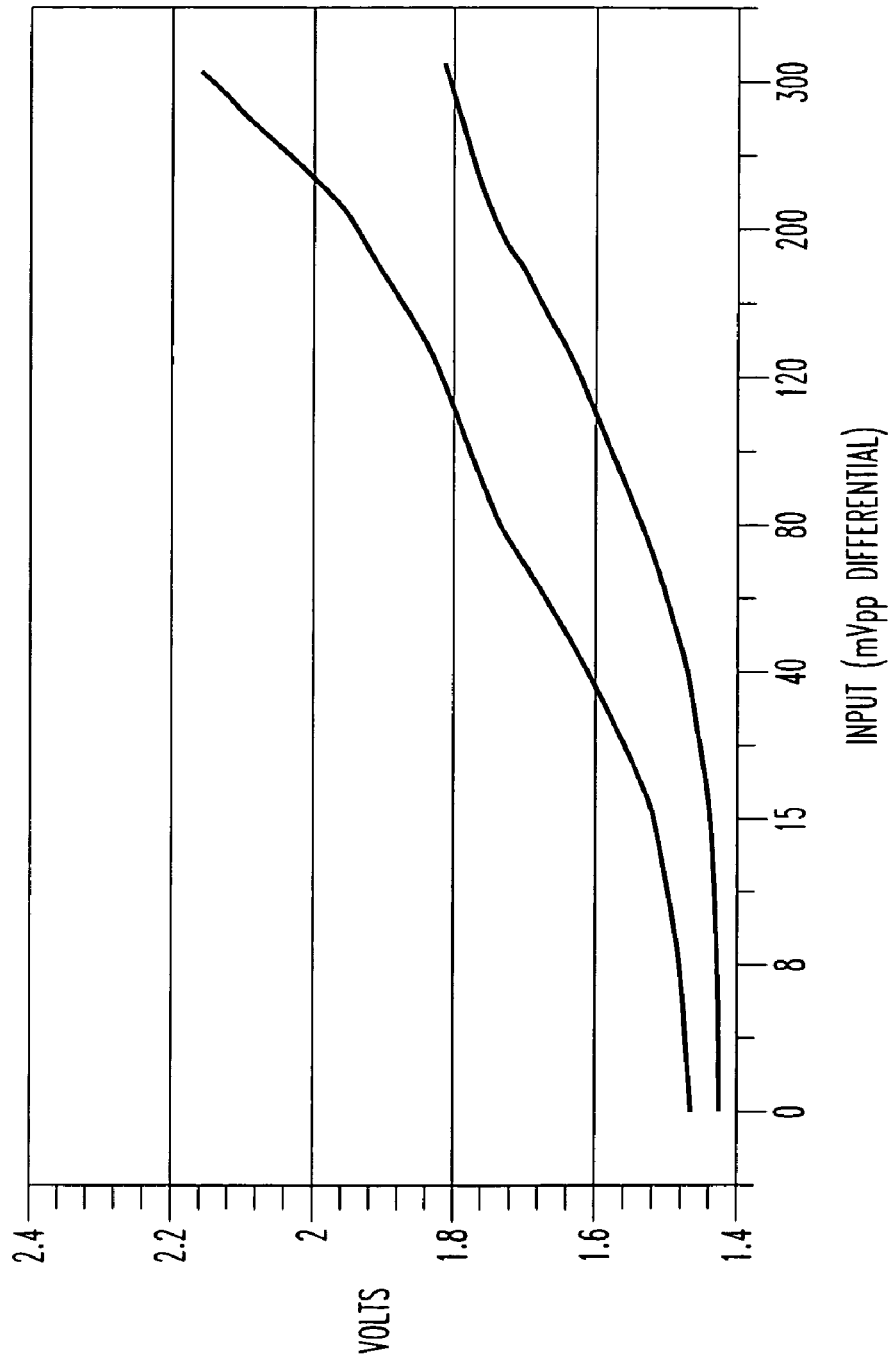
FIG. 5 demonstrates a wide dynamic range provided by the present invention.
Figure 6:
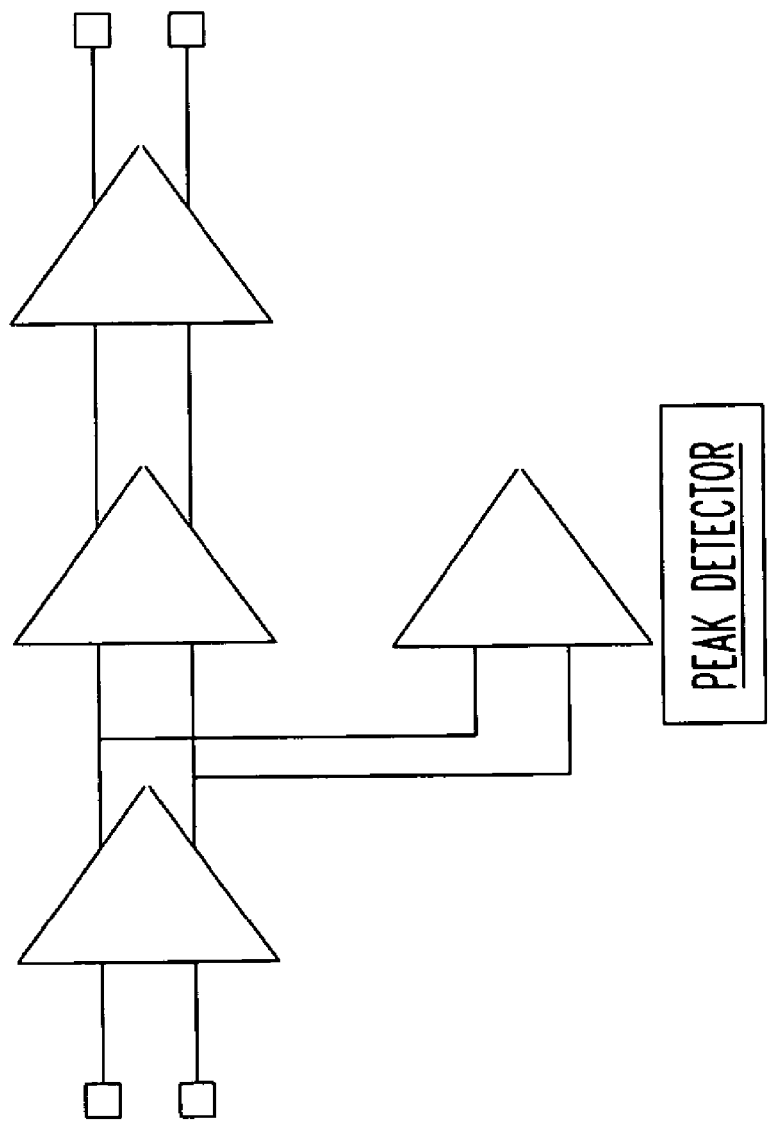
FIG. 6 shows a conventional limiting amplifier-peak detector architecture with the peak detector connected at a point far from the input pads.

FIG. 5 demonstrates that a wide dynamic range is provided by the present invention as opposed to a conventional receiver circuit that would otherwise have the input to the peak detector 100 connected to an output of a first stage 200 or second stage 202, or some stage successively removed from the input of the limiting amplifier 160.

A wider dynamic range provides an output of the peak detector with much more resolution, providing a better measurement of the voltage level of the input signal. For instance, presume that the signal input to the first stage 200 of the limiting amplifier 160 were to be, e.g., 0-10V. In such a case, the level of signal being input to the limiting amplifier 160 could be finely measured throughout its range of 0-10V.

However, presume that the gain of the first stage 200 of the limiting amplifier 160 is one hundred (100). In such a case, when measuring the level of the input signal after the first stage 200 of the limiting amplifier 160, the signal would theoretically swing between 0 and 1000V. Obviously, saturation is reached quickly, and accurate measurement of the input signal beyond "present" and "not present" is difficult at best.

The present inventor has appreciated that advantages can be obtained with more accurate measurement of an input signal at its source, before saturation becomes a possibility by measurement after a first amplifier stage, particularly at extremely high data rates such as OC192.

Impedance mismatch of the transmission lines between the input to the peak detector and the input of the first amplifier stage is significantly minimized in the disclosed embodiments, such that the peak detector appears as a load with insignificant capacitance with respect to an extremely high data rate of a signal on the input. In terms of return loss, a return loss of at least 14 dB to 15 dB is preferred. In terms of VSWR, 1.5 to 1 VSWR is preferred. In terms of ohms, this translates to approximately 50 ohms/1.5=75 ohms at a highest point in a typical signal range between about 10 MHz and 12 GHz, and 50/1.5=33 ohms at a lowest point in the same signal range. Thus, an impedance in the transmission line between about 33 ohms and 75 ohms is preferred, presuming an ideal match is 50 ohms, to minimize a mismatch in impedance in the transmission line between the input to the peak detector and the input to the first amplifier stage.

While the invention has been described with reference to the exemplary embodiments thereof, those skilled in the art will be able to make various modifications to the described embodiments of the invention without departing from the true spirit and scope of the invention.

What is claimed is:

1. A data receiver comprising:
    a limiting amplifier comprising a plurality of amplifier stages;
    a peak detector measuring a voltage level of an input to said limiting amplifier, an input to said peak detector being connected directly to an input of a first one of said plurality of amplifier stages of said limiting amplifier; and
    a bias generator used to bias both said input to said peak detector as well as said input to said first one of said plurality of amplifier stages;
    wherein a mismatch in impedance of transmission lines used between said input to said peak detector and said input of said first one of said plurality of amplifier stages of said limiting amplifier is minimized such that said peak detector appears as a load with insignificant capacitance with respect to an extremely high data rate of a signal on said input.

2. The data receiver according to claim 1, wherein:
    an impedance of said transmission line is between 33 ohms and 75 ohms throughout a frequency range of operation.

3. The data receiver according to claim 2, wherein:
    said frequency range of operation is between 10 GHz and 12 GHz.

4. The data receiver according to claim 1, further comprising:
    a latch circuit connected to an output of said peak detector.

5. The data receiver according to claim 4, wherein:
    said peak detector and said latch circuit form a loss of signal circuit detecting a loss of signal input to said limiting amplifier.

6. A method of measuring a signal having an extremely high data rate of at least 2.5 Gb/s input to a limiting amplifier, comprising:
    minimizing a mismatch of impedance between an input to a first stage of said limiting amplifier, and transmission leads connected between said input to said first stage of said limiting amplifier and an input to a peak detector such that said peak detector appears as a load with insignificant capacitance with respect to an extremely high data rate of a signal on said input;
    biasing said peak detector bias with a same bias used to bias said first stage of said limiting amplifier; and
    directly measuring through an input to said peak detector connected directly to a first stage of said limiting amplifier a signal having a data rate of at least 2.5 Gb/s being input to said first stage of said limiting amplifier.

7. The method of measuring a signal having an extremely high data rate according to claim 6, further comprising:
    latching an output of said peak detector.

8. The method of measuring a signal having an extremely high data rate according to claim 7, wherein:
    said latching provides a loss of signal indication relating to said signal input to said first stage of said limiting amplifier.

9. Apparatus for measuring a signal having an extremely high data rate of at least 2.5 Gb/s input to a limiting amplifier, comprising:
    means for minimizing a mismatch of impedance between an input to a first stage of said limiting amplifier, and transmission leads connected between said input to said first stage of said limiting amplifier and an input to a peak detector using differential transmission lines such that said peak detector appears as a load with insignificant capacitance with respect to an extremely high data rate of a signal on said input;
    means for biasing said peak detector bias with a same bias used to bias said first stage of said limiting amplifier; and
    means for directly measuring through an input to said peak detector connected directly to a first stage of said limiting amplifier a signal having a data rate of at least 2.5 Gb/s being input to said first stage of said limiting amplifier.

10. The apparatus for measuring a signal having an extremely high data according to claim 9, further comprising:
   means for latching an output of said peak detector.

11. The apparatus for measuring a signal having an extremely high data rate according to claim 10, wherein:
   said means for latching provides a loss of signal indication relating to said signal input to said first stage of said limiting amplifier.

* * * * *